United States Patent [19]

Zemek et al.

[11] Patent Number: 4,470,182

[45] Date of Patent: Sep. 11, 1984

[54] METHOD AND APPARATUS FOR CENTERING ELECTRICAL COMPONENTS

[75] Inventors: Albert W. Zemek, Windsor; James A. Pavlik, Conklin; Frank J. Orzelek, Binghamton, all of N.Y.

[73] Assignee: Universal Instruments Corporation, Binghamton, N.Y.

[21] Appl. No.: 394,122

[22] Filed: Jul. 1, 1982

[51] Int. Cl.³ .......................... H05K 3/30; B23P 19/00
[52] U.S. Cl. ........................................ 29/834; 29/741; 227/90; 227/109
[58] Field of Search .......................... 29/834, 739, 741; 140/71 R; 227/2, 90, 109

[56] References Cited

U.S. PATENT DOCUMENTS

| | | | |
|---|---|---|---|
| 3,167,780 | 2/1965 | Mueller | 227/90 X |
| 3,783,488 | 1/1974 | Ragard | 29/741 X |
| 3,796,363 | 3/1974 | Ragard | 227/90 X |
| 4,417,683 | 11/1983 | Lewis et al. | |

Primary Examiner—Charlie T. Moon
Assistant Examiner—Carl J. Arbes
Attorney, Agent, or Firm—Fidelman, Wolffe & Waldron

[57] ABSTRACT

A method and apparatus is disclosed for sequentially centering off-center bodies of a series of taped electrical components such that the component leads may be formed or bent closely to the bodies to realize denser population of the components on a circuit board. Fragile-lead components are protected by trimming the leads to remove the components from the tapes prior to centering the bodies.

8 Claims, 19 Drawing Figures

METHOD AND APPARATUS FOR CENTERING ELECTRICAL COMPONENTS

CROSS REFERENCES TO PRIOR ART

1. U.S. Pat. No. 2,848,718—ELECTRICAL COMPONENT MOUNTING APPARATUS—Hancock
2. U.S. Pat. No. 2,856,998—ARTICLE FEEDING AND CONDITIONING APPARATUS—Hancock
3. U.S. Pat. No. 3,078,466—MACHINES FOR MOUNTING ELECTRICAL COMPONENTS ON BASE MEMBERS—Harrold, et al.
4. U.S. Pat. No. 3,594,889—TERMINAL-INSERTING MACHINES HAVING IMPROVED INSIDE FORMER—Clark
5. U.S. Pat. No. 3,593,404—MULTI-SIZE DUAL CENTER DISTANCE ELECTRONIC COMPONENT INSERTION MACHINE—Ragard
6. U.S. Pat. No. Re. 27,968—MULTI-SIZE VARIABLE CENTER ELECTRONIC COMPONENT INSERTION MACHINE—Ragard, et al.
7. U.S. Pat. Application Ser. No. 319,405—CENTERING DEVICE FOR ELECTRICAL COMPONENTS—Shiptenko, et al.

BACKGROUND OF THE INVENTION

The invention relates to devices for mounting electrical components on circuit boards and, more especially, to a method and means for removing components which are attached to feed tapes by their leads by shearing portions of the tips of the leads, centering the component bodies upon a longitudinal axis generally midway between the feed tapes, forming the leads for insertion into spaced holes of the circuit board, and inserting the leads into these holes.

Printed circuit boards are formed with appropriately spaced lead receiving holes to provide for mounting of the components to the circuit board by insertion of the component leads through the holes and clinching the leads to the underside of the circuit board. Machines for mounting the components in this manner are disclosed in U.S. Pat. No. Re. 27,968 and U.S. Pat. No. 3,593,404, cross-referenced above, are typical of the prior art. Such machines receive components of various sizes and shapes which are mounted onto the tapes by their oppositely extending leads. As may be appreciated, the tolerances for insertion of the leads into the small, spaced holes of the circuit board are critical, and a component body which is off-center relative to the longitudinal axis between the spaced tapes may not allow a proper mounting of the component onto the board. For instance, the components, during mounting upon the spaced tapes, are oftentimes off-center by as much as 0.030 inches due to the tolerances of the machine which mounts the components onto the tape. This amount of miss-centering may cause misinsertion of a lead into a hole and bending of the lead and mismounting of the component. Further, in order to more closely populate components onto a circuit board, it is desirable to form or bend the leads as closely as possible to the component body. If the component arrives at the lead formers in such an off-center condition, then at least one of the leads will be formed or bent 0.030 inches from the body and require mounting holes which are spaced further apart than ideal for maximum population of the board.

In order to overcome this particular problem, a method and apparatus of centering the component bodies prior to lead forming was devised and is disclosed in the above cross-referenced U.S. Application Ser. No. 319,405 now U.S. Pat. No. 4,417,683. Although very efficiently functional in most situations, problems have occurred with this machine when component leads of very thin cross section must be handled. For instance, this prior art device engages the body of the component for centering it upon a longitudinal axis between the feed tapes prior to removing the components from the tapes by cutting the end portions of the leads, such that the leads of an off-center component are moved in a direction normal to the length of the tapes and one lead will be pulled from a tape while the oppositely extending lead will be pushed into or through the other tape. With very fragile leads, there may be damage to the muniscus or point of connection between the component and the lead which is being pulled from a tape and the oppositely extending lead may bend during pushing of it toward the other tape, such that the lead formers may not straighten the lead properly prior to insertion and mismounting of the component onto the circuit board will occur, or a defective component will be mounted upon the circuit board due to the damage to the connection between a lead and body.

The present invention overcomes this difficulty in handling components with fragile leads by trimming the ends of the leads to remove the components from the tapes prior to centering of the components about the longitudinal axis between the tapes for subsequent forming and inserting of the leads into the holes of the circuit board.

The above-referenced U.S. Pat. No. 2,856,998 discloses a device for centering electrical components. However, the device of this patent does not handle components which are fed on tapes, and it does not trim the ends of the leads prior to centering the components.

The above-referenced U.S. Pat. No. 3,078,466 discloses a device for mounting electrical components onto circuit boards in which the mounting device has two variably spaced portions which are varied in spacing each cycle for various body lengths. However, the variation of the spacing is in incremental steps of 0.1 inches or the like and is stated to be for bodies of considerably different lengths. This device does not handle components which are taped, nor does it cut the leads of the components prior to insertion or address the problem of centering the component bodies.

U.S. Pat. No. 3,594,889 discloses a machine having yieldable inside formers such that component leads of various diameters may be handled during forming of the leads. This device also does not address the problem of handling components whose bodies are off-center when received by the lead formers.

The only prior art of which applicant is aware which addresses the problem of forming or bending the leads as closely to the body as possible in order to increase population of the components onto a circuit board and of centering the bodies relative to a longitudinal axis such that the leads are uniformly bent closely to the body of the component is the above-referenced U.S. Pat. Application Ser. No. 319,405 which, as indicated above, cannot efficiently and reliably mount components whose leads are too fragile.

Accordingly, it is an object of this invention to improve upon the prior art method and apparatus of centering bodies of various lengths of components which are sequenced and attached by their leads to sequencing tapes, such that the leads of the components may be formed or bent as close as possible to the bodies of the components for increased population of the components onto the circuit board. By the method and apparatus of the instant invention, the components are removed from the tapes prior to centering so that components having very fragile leads will not be damaged at the connection between a lead and body of the component and leads will not be bent, as will occur when centering of the bodies of such components is accomplished while the components are still attached to the sequencing tapes.

DETAILED DESCRIPTION OF THE INVENTION

Figure 1:
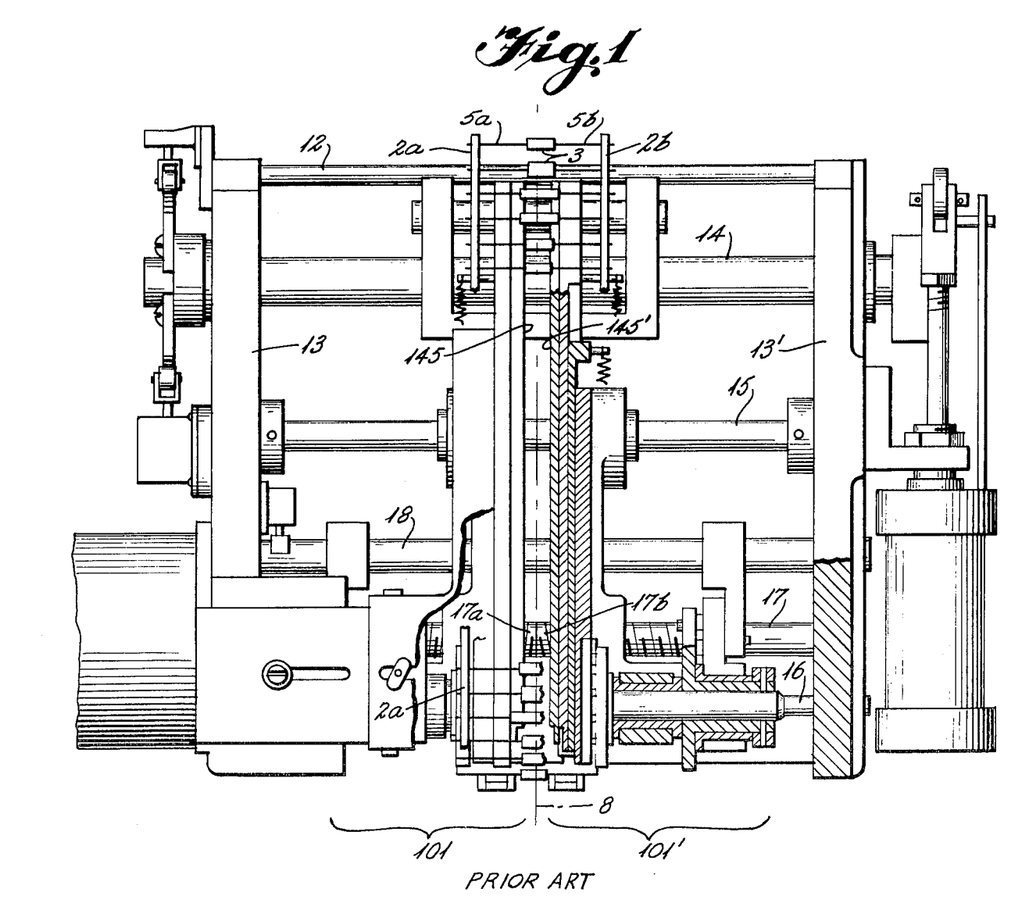
FIG. 1 is a front elevation of a prior art device for mounting electronic components onto a circuit board.

FIG. 1 discloses a variable center distance (V.C.D.) electronic component insertion machine of the type described in U.S. Pat. No. RE. 27,968. This machine has a fixed U-shaped support with back 12 and sides 13, 13'; rods 14, 15, 16 and 18 are for sidingly supporting variably spaced tooling 103, 103' of sections 101, 101'. The variable spacing is provided by a shaft 17 having equally pitched, oppositely threaded screw portions 17a, 17b which are threadedly engaged in tooling 103, 103', respectively, so that rotation of screw shaft 17 in opposite directions causes opening and closing of the tooling relative to a mid-plane 8. This opening and closing of tooling 103, 103' allows variation of the spacing therebetween so that component bodies 3, of different lengths and mounted on tapes 2a, 2b for feeding, may be accommodated to different hole spacings on circuit boards after trimming and bending or forming of leads 5a, 5b.

Figure 2:
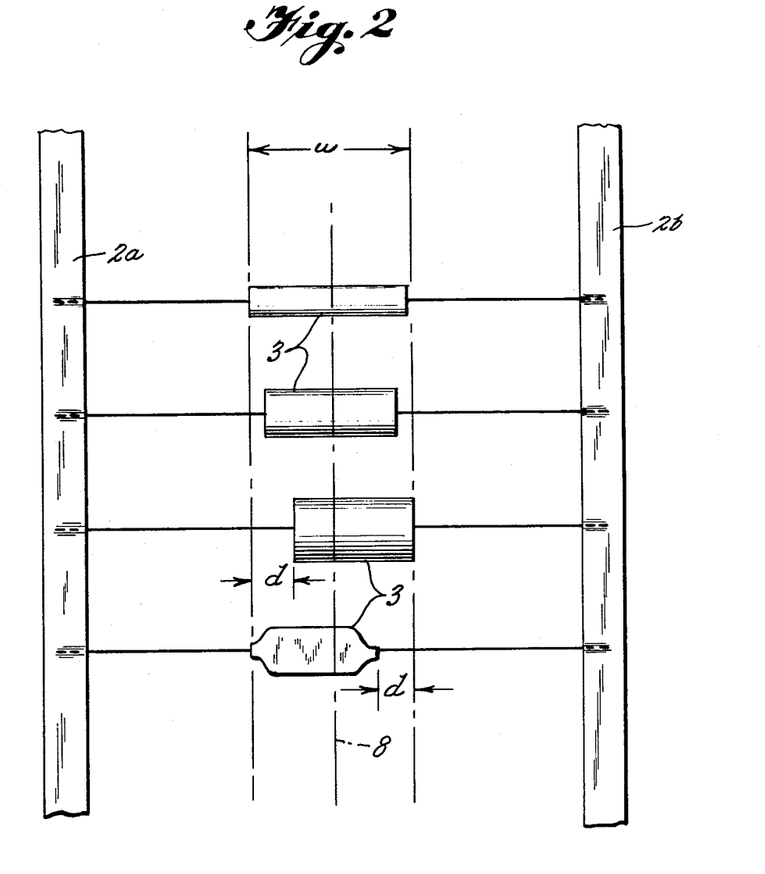
FIG. 2 is a partial, top plan view of a series of tape-mounted components, some of which are uncentered relative to a longitudinal axis.

Referring to FIG. 2, different components are fed to machines of this type in a programmed sequence as provided by a sequencing and taping machine (not shown). Because of the tolerances of the taping machine, bodies 3 of different lengths are taped so that they remain within a window of margin "w", but may be displaced in either direction by as much as a distance "d" and thus be uncentered relative to a mid-plane 8. Further, because of this uncentered condition, the insertion machine is limited as to how much the spacing between tooling 103, 103' may be narrowed during adjustment of screw shaft 17.

Since construction and operation of the machine are basically as fully described in the Ragard, et al. patent, referred to above, only so much of the apparatus will now be described as is essential to a complete understanding of the present invention.

Figure 3A:
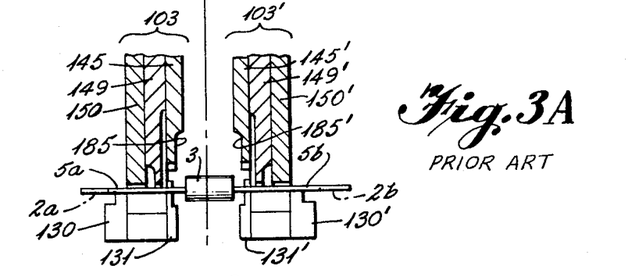
FIG. 3A–3C are sectional views of a prior art device of the type illustrated in FIG. 1 and showing several steps in mounting a component on a circuit board.
Figure 3B:
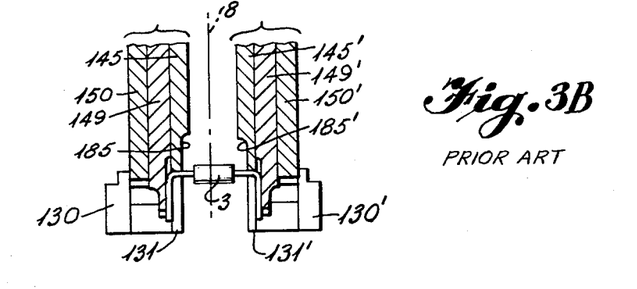
Figure 3C:
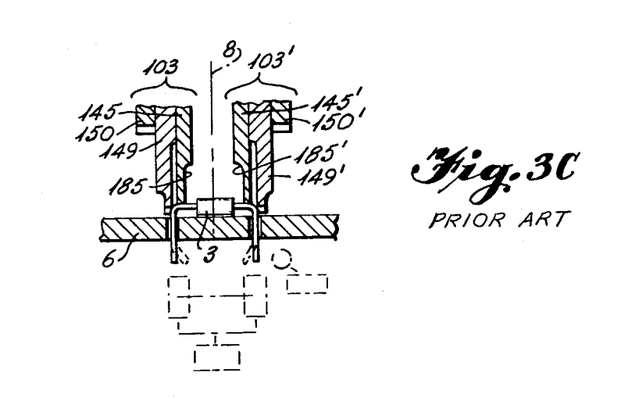

Referring to FIGS. 3A, 3B, 3C, prior art devices of the type illustrated in FIG. 1 are adapted to sequentially feed a taped component to the position of FIG. 3A in which leads 5a and 5b of a component 3 are held by inside formers 13, 131' such that the leads 5a, 5b are slightly above cutting anvils 130, 130'. When the apparatus is actuated further, cutters 150, 150' descend and cooperate with anvils 130, 130' to trim leads 5a and 5b and thus remove the component from the taped series. Referring to FIG. 3B, further actuation of the device causes outside formers 149, 149', in cooperation with inside formers 131, 131', to bend and form the remaining portions of the leads for 5a, 5b insertion of the component 3 into spaced holes of the circuit board. In FIG. 3C, it can be seen that drivers 185, 185' have engaged the leads of the components and have driven them into the spaced holes of a circuit board 6 for subsequent clinching of the leads by a lead clinching head which is generally shown in phantom lines.

Figure 4:
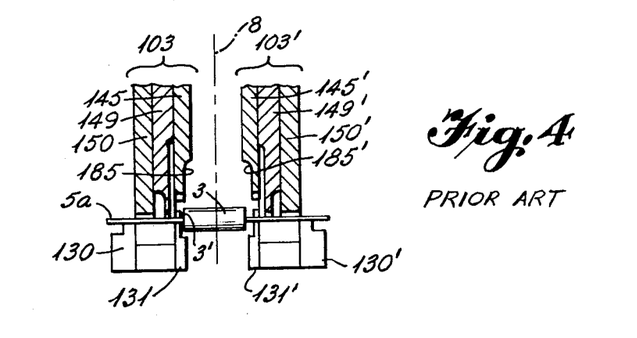
FIG. 4 is a sectional view of a portion of the prior art device of FIG. 1 to illustrate a problem encountered with an uncentered component.

FIG. 4 illustrates a problem encountered in the prior art when, for instance, all of the component bodies are of the same length but are uncentered about a mid-plane 8, so that upon lowering of drivers 185, 185' the left end 3' of component 3 may be crushed or damaged by the left driver 185. In order to overcome this problem, the above cross-referenced U.S. Application Ser. No 319,405 now U.S. Pat. No. 4,417,603 discloses a method and apparatus of centering a component 3 relative to mid-plane 8 such that damage by lowering of the driver cannot occur and such that the leads may be bent or formed closer to the body of the component and closer hole spacing of the circuit board and denser population thereof with components may be accomplished. However, in the Shiptenko, et al. device, centering of the component body relative to mid-plane 8 is accomplished while the components are still mounted on tapes 2a, 2b, and it has been found that components having very fragile leads may be damaged during the centering function.

Figure 5:
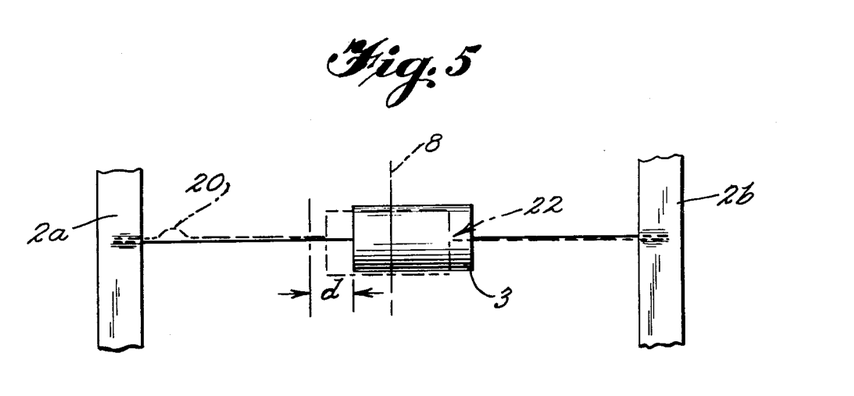
FIG. 5 is a partial, top plan view of a tape-mounted component to illustrate a problem encountered in a prior art device which centers the components.

FIG. 5 illustrates the damage that sometimes occurs during centering of an off-center body of a component by the Shiptenko, et al. device. With the component 3 still attached to tapes 2a, 2b and off-center with respect to mid-plane 8, the prior art centering device engages the body of the component and shifts it to the centered, phantom-line position of FIG. 5. With components having very fragile leads, at least one of two problems often occurs during this shifting of the tape-mounted component, namely, the left lead (as viewed in FIG. 5) which is still attached to the tape 2a will bend, as at 20, and/or the connection 22 of the right lead to the body of the component will be put in tension such that separation of the lead from the body or damage to the muniscus may occur, resulting in a component which is defective or will become defective before its expected lifetime.

Figure 6:
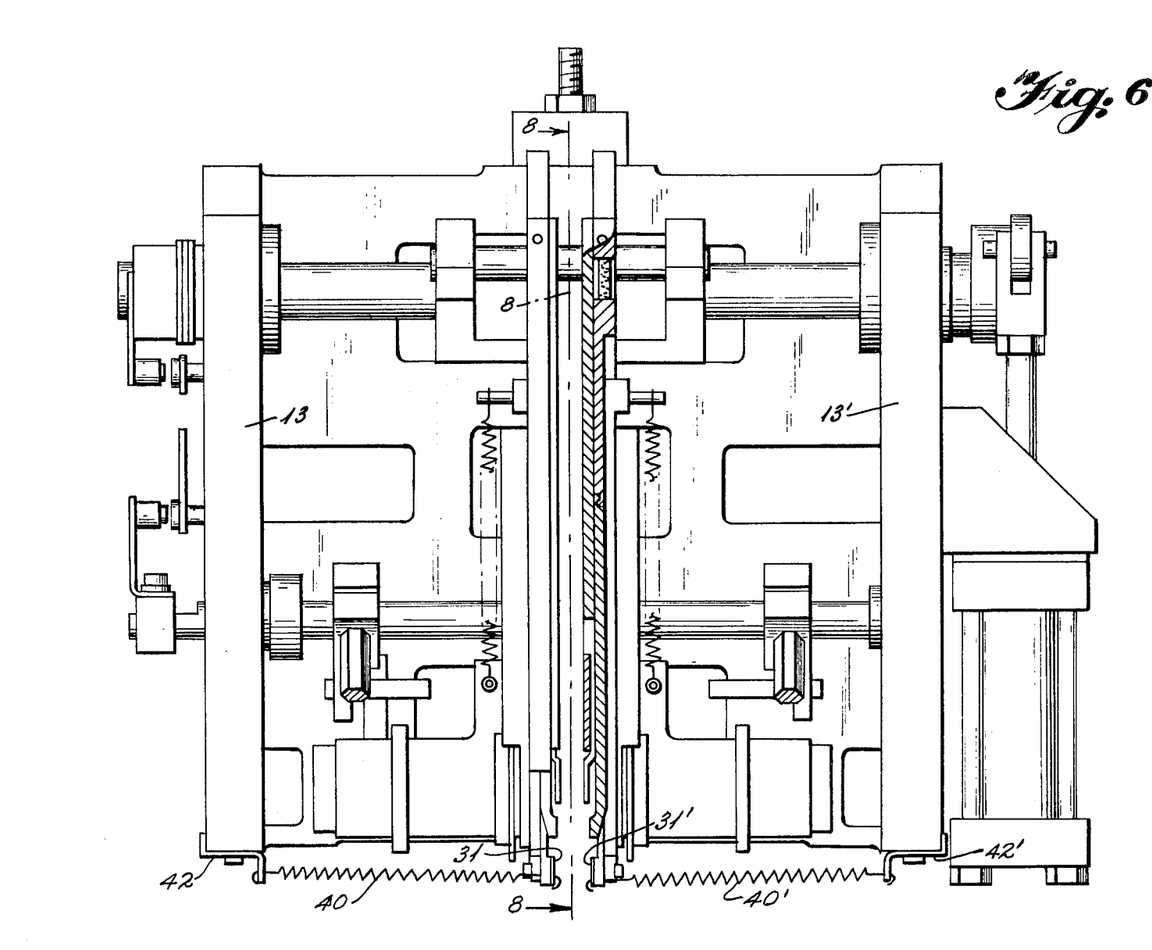
FIG. 6 is a front elevation of a preferred embodiment of the apparatus of the instant invention.
Figure 7A:
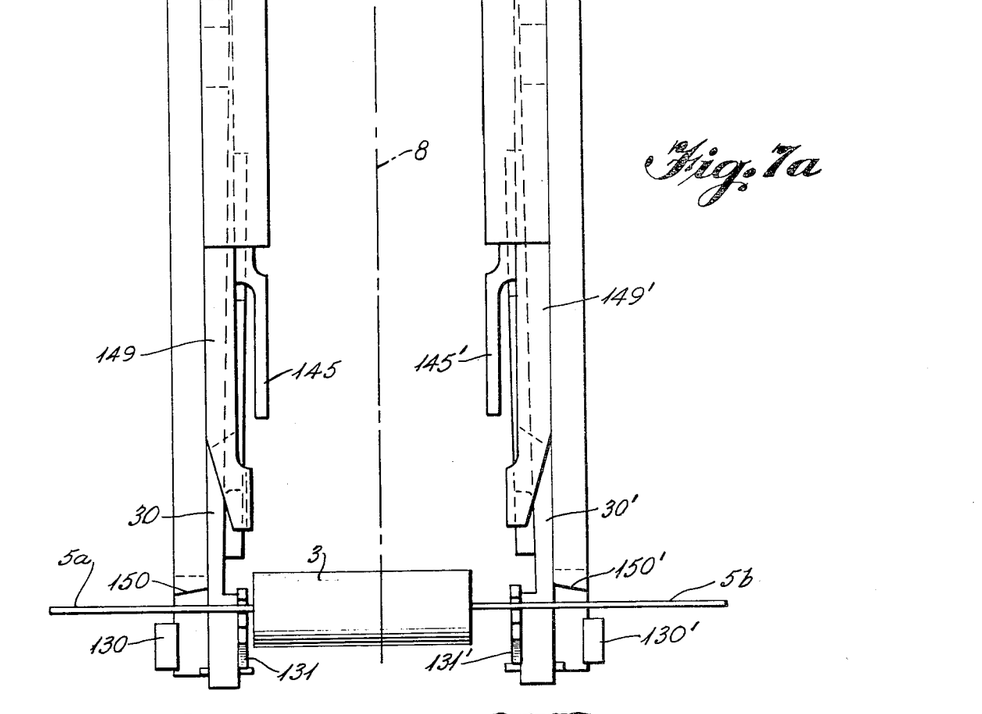
FIGS. 7A and 7B are enlarged views of a portion of the device of FIG. 6 prior to and after centering of a component.
Figure 7B:
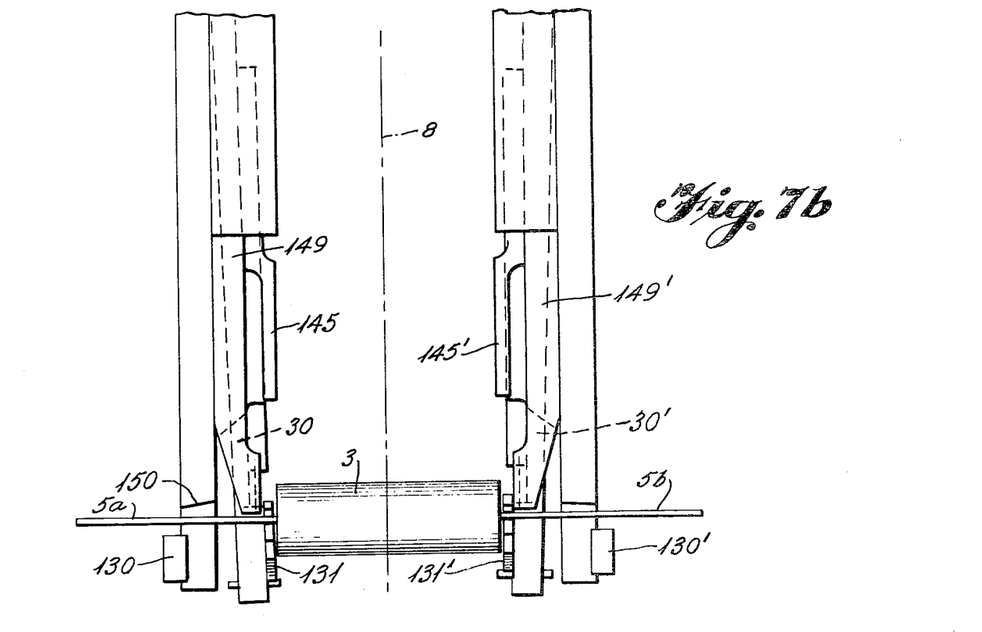
Figures 8, 10A, 10B:
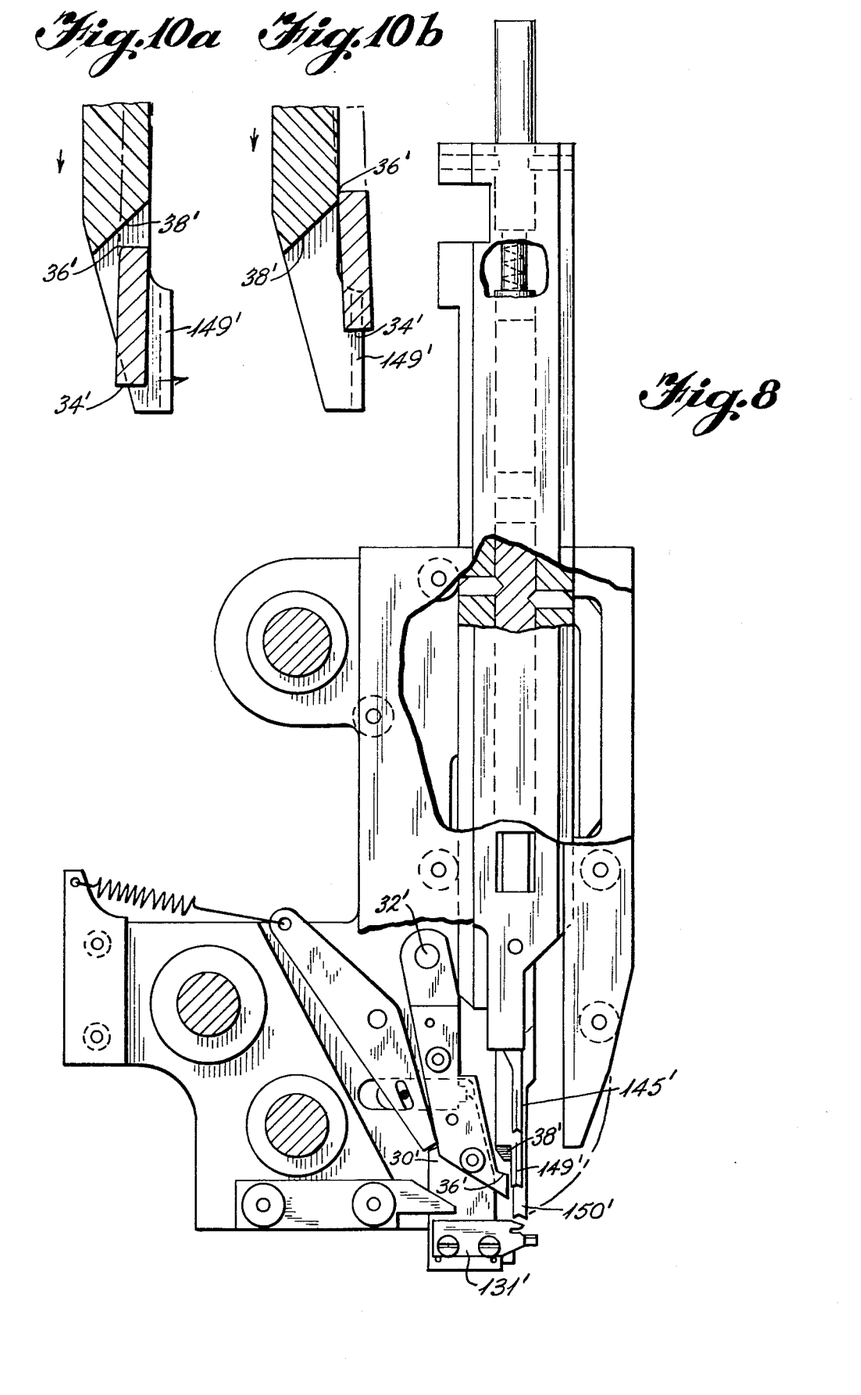
FIG. 8 is a left-side elevation of the right half of the device as viewed along arrows 8—8 of FIG. 6.
FIGS. 10A and 10B are partial sectional views along arrows 10A—10A and 10B—10B of FIGS. 9B and 9C, respectively.

The instant invention overcomes the above-noted problems while allowing bending or forming of the leads as closely as possible to the body so that the components may be mounted to circuit boards having reduced hole spacing and, hence, greater population possibilities. FIG. 6 is a front elevation of the apparatus of the instant invention and FIG. 8 is a left-side elevation of the right half (as viewed in FIG. 6) of the adjustable tooling of the apparatus. Referring to FIG. 8, for the overall location and general structure of portions of the device which are of particular interest, taped components are fed sequentially (down the right side of the structure of FIG. 8) for reception of each lead in a bifurcated inside former 131'. Kickout arm 30' has inside former 131' attached to the bottom thereof and is pivotal about a dowel 32' such that it pivots in the clockwise direction to remove any obstruction to a component whose leads have been trimmed and formed for insertion into the holes of a circuit board. Moveable cutter 150' will engage a lead and trim the end thereof prior to the bending or forming of the lead by the cooperation of outside former 149' and inside former 131' such that driver arm 145' can engage the formed lead near the body and drive it into the holes of the circuit board. After trimming the ends of the leads to remove the component from the taped series of components, the instant invention provides for centering of the body of the component about a mid-plane 8 by "squeezing" kickout arms 30 and 30' (and their attached inside formers 131 and 131') toward mid-plane 8. In this manner, one of the inside formers 131, 131' will engage the end of the component body 3 which is displaced furthest from mid-plane 8 to move the body 3 to a centered position. Referring to FIGS. 7A and 7B, component body 3 is centered from the off-center position of FIG. 7A, to the position of FIG. 7B showing the centered body 3 and "squeeze" position of the kickout arms 30, 30'.

After a component is inserted and drivers 145, 145' begin to retract, springs 40, 40' bias the inside formers 30, 30' to their spread position.

Figure 9A:
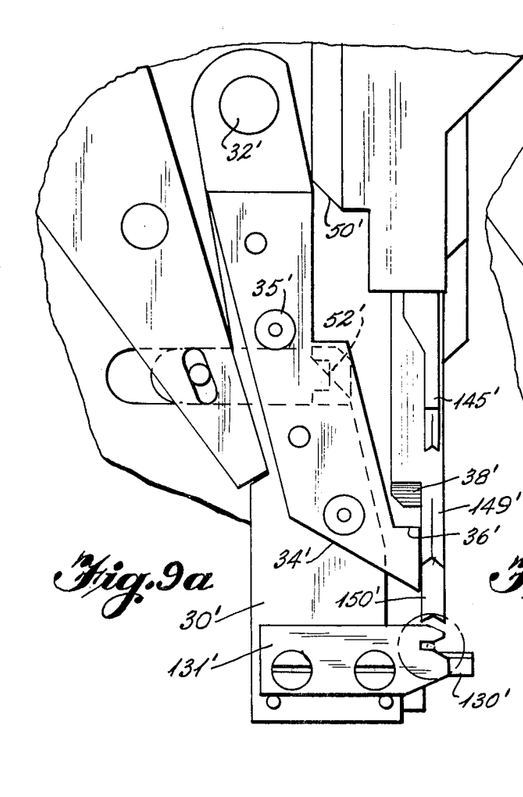
FIGS. 9A–9F are partial views of the device of FIG. 8 for illustrating operation of the device.
Figure 9B:
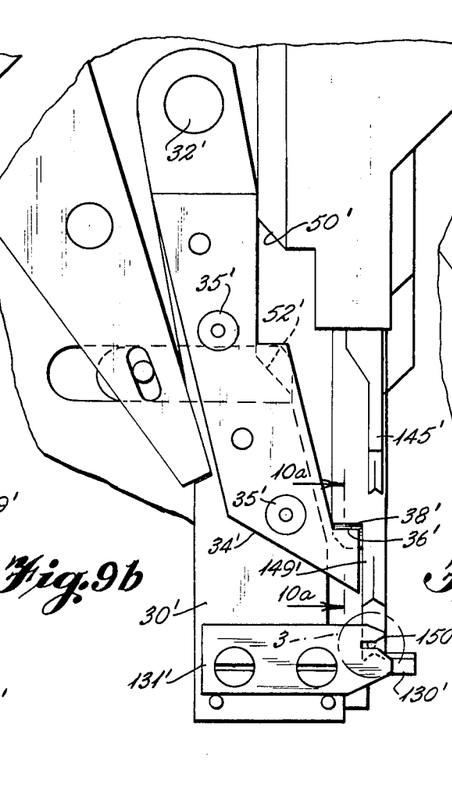
Figure 9C:
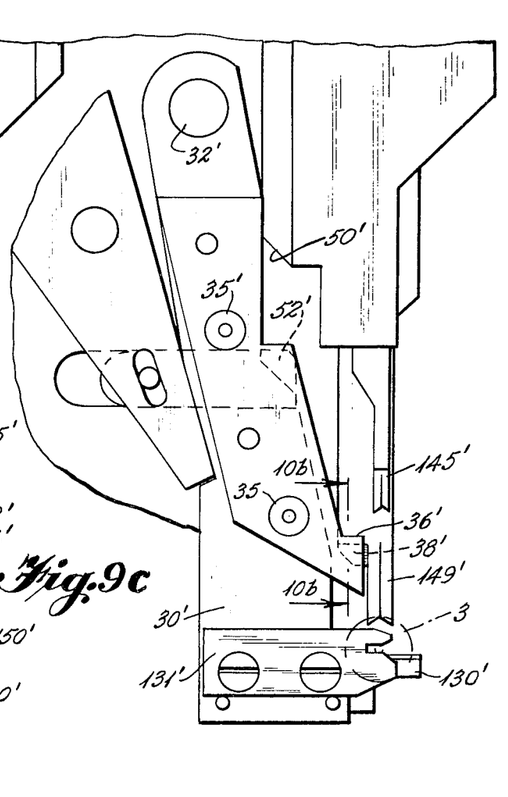
Figure 9D:
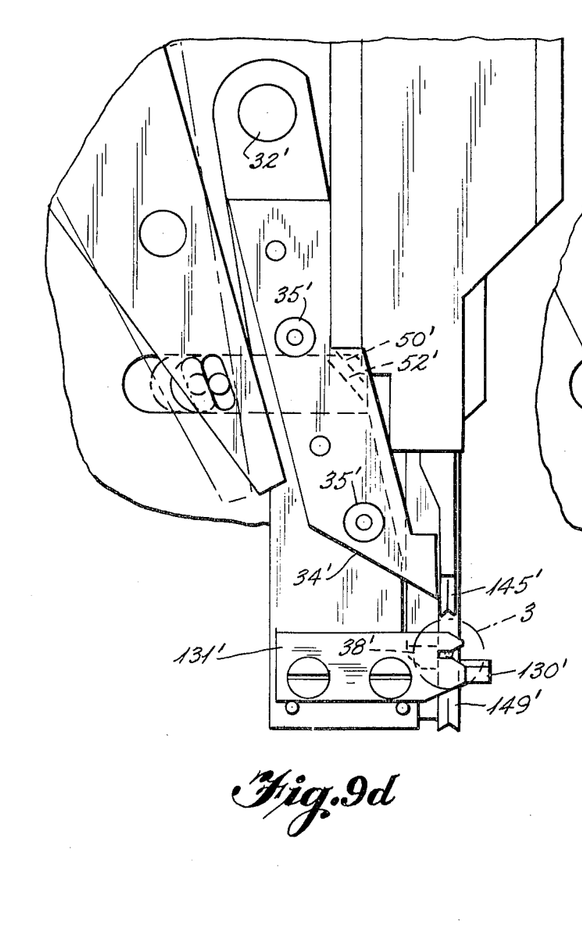
Figure 9E:
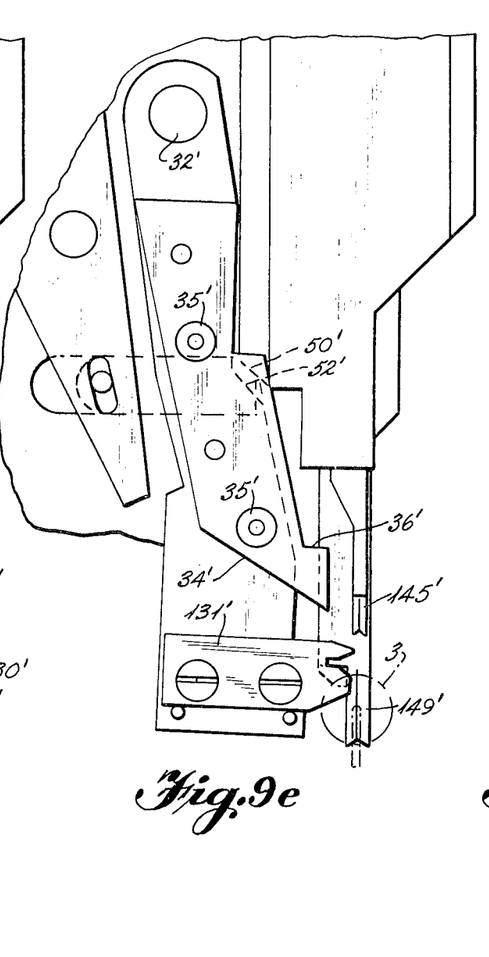
Figure 9F:
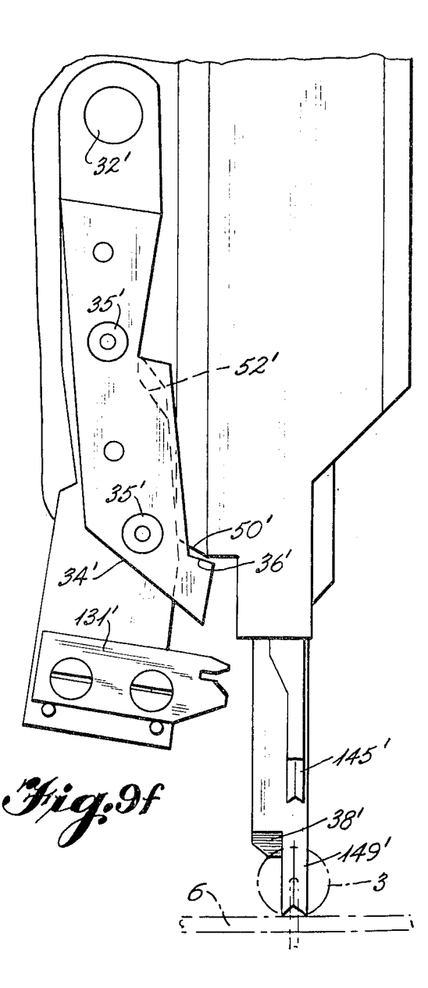

For a better understanding of the manner in which "squeezing" is accomplished, reference should be had to FIGS. 9A–9E. FIG. 9A discloses kickout arm 30' in the extreme counterclockwise position for reception of a taped component lead into the bifurcation of inside former 131' and illustrates the positions of cutter arm 150', outside former 149' and driver 145' prior to lead trimming and removing of the component from the taped series. Attached to kickout arm 30', as by machine screws 35', is a cam plate 34', having a radius 36' (on the opposite side of plate 34' as viewed in FIGS. 9A–9E) for cooperation with a cam surface 38' of outside former 149' during "squeezing". FIG. 9B discloses the relative positions of the parts after cutter 150' has cooperated with cutting anvil 130' to shear the tip of the lead and remove the component from the taped series. In FIG. 9C, outside former 149' has moved downwardly to cause engagement of camming surface 38' with camming surface 36' and facilitate the "squeezing" action. In a prototype of the apparatus of the invention, kickout arm 30' does not slide along support dowel 32' during this "squeezing". Rather, the tolerance of connection between dowel 32' and kickout arm 30' is such that there is pivotal motion of kickout arm 30' in a direction generally perpendicular to the arc of "kickout" rotation of arm 30' about dowel 32'. After the leads have been trimmed, the component body has been centered, and the leads have been formed or bent for insertion into the printed circuit board holes, the driver arms lower to engage the leads for this insertion as can be viewed by the position of driver arm 145' just prior to engagement of a formed lead. Continued lowering of driver 145' also results in "kickout" or pivoting of the kickout arm 30' in a clockwise direction (as viewed in FIGS 9E and 9F) so that the inside formers which are supporting the leads of the component are moved out of the way during the insertion step. This clockwise pivoting action of the kickout arms is facilitated in the usual manner, as by engagement of the driver body surface 50' with kicker arm surface 52'. Surfaces 50' and 52' have been modified from their usual configuration such that kickout arms 30, 30' are held in the squeezed position (as indicated in phantom lines in FIG. 7) until drivers 145, 145' begin their upward movement after insertion of a component. As will be appreciated, means are provided for pivoting kickout arms 30, 30' in a counterclockwise direction back to the position indicated in FIG. 9A for cycling of the next component.

Reference should be had to FIGS. 10A and 10B for a better understanding of the "squeeze" action implementation by engagement of cam surface 38' of outside former 149' with radius 36' of kickout arm 30'.

By way of example, it has been found that the tolerances provided in the sequencing and taping device (not shown) which mounts the series of components in a particular sequence upon tapes 2a, 2b may result in a component being off-center by as much as 0.030 inches. In a prototype device of the instant invention, each kickout arm could "squeeze" inwardly by 0.050 inches for centering of an off-center component body.

While only one embodiment of the present invention has been described in detail, various modifications thereof and additions thereto will become apparent to those skilled in the art in view of the foregoing description. For example, various other means of "squeezing" the inside formers 131, 131' to center a component body may be provided. Further, it will likely occur to one skilled in the art that the present invention has utility in processing components wherein it is desired to perform one or more of the cutting, bending, and inserting operations to provide processed components which may thereafter be further processed by other apparatus.

Accordingly, the scope of the present invention is to be limited only by the scope of the appended claims.

We claim:

1. A method of mounting electrical components on a circuit board, each of said components comprising a body and leads extending in generally opposite directions from said body, said method comprising the steps of: cyclically indexing a series of said components attached to and between spaced tapes by said leads and sequentially presenting each component of said series between first and second lead receiving sections spaced equally from a mid-plane of said apparatus, generally centering components which are off-center relative to said mid-plane by moving a component body end which is farthest away from siad mid-plane toward said mid-plane, trimming end portions of said leads to remove said components from said tapes, forming and driving remaining body-attached portions of said leads into spaced holes of said circuit board for subsequent clinching of said leads to an opposite side of said circuit board from said body, and trimming said end portions and removing said components from said tapes prior to said centering.

2. A method as in claim 1, and further comprising the step of: engaging and pushing said component body end toward said mid-plane to effect said moving and centering.

3. A method as in claim 1, and further comprising the step of: performing said centering by substantially centering off-center component bodies relative to said mid-plane.

4. In an apparatus for mounting electrical components on a circuit board, each of said components comprising a body and leads extending in generally opposite directions from said body, said apparatus comprising means for cyclically indexing a series of said components and presenting bodies of said components individually and sequentially between first and second lead receiving sections spaced equally from a mid-plane of said apparatus, each of said lead receiving sections comprising means for trimming an end portion of a lead to remove said component from said tapes, and forming and driving a remaining portion of said lead into a hole of said circuit board for subsequent clinching of said leads to an opposite side of said circuit board from said body, the improvement comprising:

means for generally centering components having bodies off-center relative to said mid-plane prior to said forming and driving; and means for trimming end portions of said leads of each component and removing said components from said tapes prior to said centering, such that bending of a lead and damage to a lead and body connection of a component having said off-center body, when centering while said component is attached to said tapes, is prevented.

5. An improvement as in claim 4, wherein said centering means further comprises:

means for substantially centering said off-center bodies relative to said mid-plane.

6. An improvement as in claim 4, wherein:

said forming means of each section comprises an inside former and an outside former cooperating with said inside former and bending said remaining portion for insertion into said hole; and said centering means comprises means for camming said inside formers toward said mid-plane and engaging at least one end of said off-center body and moving said off-center body in a direction generally perpendicular to said mid-plane.

7. An improvement as in claim 6, wherein said centering means further comprises:

a camming surface on each of said outside former and a radius surface on support means for each of said inside formers, said camming surface and said radius surface cooperating prior to said forming to displace said inside formers toward said mid-plane; and a means for biasing said inside formers away from said mid-plane after said forming.

8. An improvement as in claim 7, wherein said biasing means comprises:

springs connected respectively between each of said inside formers and a housing of said apparatus.

* * * * *